US006999531B2

(12) United States Patent
Jin

(10) Patent No.: US 6,999,531 B2
(45) Date of Patent: Feb. 14, 2006

(54) SOFT-DECISION DECODING OF CONVOLUTIONALLY ENCODED CODEWORD

(75) Inventor: Gary Q. Jin, Kanata (CA)

(73) Assignee: 1021 Technologies KK, Yokohama (JP)

( * ) Notice: Subject to any disclaimer, the term of this patent is extended or adjusted under 35 U.S.C. 154(b) by 756 days.

(21) Appl. No.: 09/791,608

(22) Filed: Feb. 26, 2001

(65) Prior Publication Data

US 2001/0021233 A1 Sep. 13, 2001

(30) Foreign Application Priority Data

Mar. 1, 2000 (GB) .................................... 0004765

(51) Int. Cl.
*H03D 1/00* (2006.01)
*H04L 27/06* (2006.01)

(52) U.S. Cl. ...................... 375/341; 375/262; 375/265; 714/794; 714/795; 714/796; 714/792

(58) Field of Classification Search ................ 375/262, 375/265, 341; 714/786, 792, 794, 795, 796
See application file for complete search history.

(56) References Cited

U.S. PATENT DOCUMENTS

| | | | | |
|---|---|---|---|---|
| 4,802,174 | A | 1/1989 | Hiraiwa et al. | |
| 5,721,746 | A | 2/1998 | Hladik et al. | |
| 5,933,462 | A * | 8/1999 | Viterbi et al. | 375/341 |
| 6,014,411 | A | 1/2000 | Wang | 375/259 |
| 6,028,899 | A | 2/2000 | Petersen | 375/341 |
| 6,189,126 | B1 * | 2/2001 | Ulmer et al. | 714/795 |
| 6,400,290 | B1 * | 6/2002 | Langhammer et al. | 341/94 |
| 6,477,679 | B1 * | 11/2002 | Such et al. | 714/755 |
| 6,484,283 | B2 * | 11/2002 | Stephen et al. | 714/786 |
| 6,510,536 | B1 * | 1/2003 | Crozier et al. | 714/755 |
| 6,563,877 | B1 * | 5/2003 | Abbaszadeh | 375/242 |
| 6,807,239 | B2 * | 10/2004 | Sugimoto et al. | 375/341 |

FOREIGN PATENT DOCUMENTS

| | | |
|---|---|---|
| EP | 0 409 205 A2 | 7/1990 |
| EP | 0963048 A2 | 8/1999 |

OTHER PUBLICATIONS

Pietrobon, Steven S., "Implementation and performance of a turbo/map decoder", International Journal of Satellite Communications, 1998, pp. 23-46.
In San Jeon, et al., "An efficient turbo decoder architecture for IMT2000", IEEE, 1999, pp. 301-304.
Khaleghi, F., et al., "On symbol-based turbo codes for cdma2000", IEEE, 1999, pp. 471-475.
Hsu, Jah-Ming et al., "On finite-precision implementation of a decoder for turbo codes", IEEE, 1999, pp. 423-426.
Wang, Zhongfeng, et al., "VLSI implementation issues of turbo decoder design for wireless applications", IEEE, 1999, pp. 503-512.
Shung, C. Bernard, et al., "VLSI architectures for metric normalization in the viterbi algorithm", IEEE, 1990, pp. 1723-1728.

* cited by examiner

*Primary Examiner*—Jean B. Corrielus

(57) ABSTRACT

A method and apparatus for decoding convolutional codes used in error-correcting circuitry for digital data communication. To increase the speed and precision of the decoding process, the branch and/or state metrics are normalized during the soft decision calculations, whereby the dynamic range of the decoder is better utilized. Another aspect of the invention relates to decreasing the time and memory required to calculate the log-likelihood ratio by sending some of the soft decision values directly to a calculator without first storing them in memory.

38 Claims, 7 Drawing Sheets

SOFT-DECISION DECODING OF CONVOLUTIONALLY ENCODED CODEWORD

FIELD OF THE INVENTION

The present invention relates to maximum a posteriori (MAP) decoding of convolutional codes and in particular to a decoding method and a turbo decoder based on the LOG-MAP algorithm.

BACKGROUND OF THE INVENTION

In the field of digital data communication, error-correcting circuitry, i.e. encoders and decoders, is used to achieve reliable communications on a system having a low signal-to-noise ratio (SNR). One example of an encoder is a convolutional encoder, which converts a series of data bits into a codeword based on a convolution of the input series with itself or with another signal. The codeword includes more data bits than are present in the original data stream. Typically, a code rate of ½ is employed, which means that the transmitted codeword has twice as many bits as the original data. This redundancy allows for error correction. Many systems also additionally utilize interleaving to minimize transmission errors.

The operation of the convolutional encoder and the MAP decoder are conveniently described using a trellis diagram which represents all of the possible states and the transition paths or branches between each state. During encoding, input of the information to be coded results in a transition between states and each transition is accompanied by the output of a group of encoded symbols. In the decoder, the original data bits are reconstructed using a maximum likelihood algorithm e.g. Viterbi Algorithm. The Viterbi Algorithm is a decoding technique that can be used to find the Maximum Likelihood path in the trellis. This is the most probable path with respect to the one described at transmission by the coder.

The basic concept of a Viterbi decoder is that it hypothesizes each of the possible states that the encoder could have been in and determines the probability that the encoder transitioned from each of those states to the next set of encoder states, given the information that was received. The probabilities are represented by quantities called metrics, of which there are two types: state metrics $\alpha$ ($\beta$ for reverse iteration), and branch metrics $\gamma$. Generally, there are two possible states leading to every new state, i.e. the next bit is either a zero or a one. The decoder decides which is the most likely state by comparing the products of the branch metric and the state metric for each of the possible branches, and selects the branch representing the more likely of the two.

The Viterbi decoder maintains a record of the sequence of branches by which each state is most likely to have been reached. However, the complexity of the algorithm, which requires multiplication and exponentiations, makes the implementation thereof impractical. With the advent of the LOG-MAP algorithm implementation of the MAP decoder algorithm is simplified by replacing the multiplication with addition, and addition with a MAX operation in the LOG domain. Moreover, such decoders replace hard decision making (0 or 1) with soft decision making ($P_{k0}$ and $P_{k1}$). See U.S. Pat. No. 5,499,254 (Masao et al) and U.S. Pat. No. 5,406,570 (Berrou et al) for further details of Viterbi and LOG-MAP decoders. Attempts have been made to improve upon the original LOG-MAP decoder such as disclosed in U.S. Pat. No. 5,933,462 (Viterbi et al) and U.S. Pat. No. 5,846,946 (Nagayasu).

Recently turbo decoders have been developed. In the case of continuous data transmission, the data stream is packetized into blocks of N data bits. The turbo encode provides systematic data bits and includes first and second constituent convolutional recursive encoders respectively providing e1 and e2 outputs of codebits. The first encoder operates on the systematic data bits providing the e1 output of code bits. An encoder interleaver provides interleaved systematic data bits that are then fed into the second encoder. The second encoder operates on the interleaved data bits providing the e2 output of the code bits. The data uk and code bits e1 and e2 are concurrently processed and communicated in blocks of digital bits.

However, the standard turbo-decoder still has shortcomings that need to be resolved before the system can be effectively implemented. Typically, turbo decoders need at least 3 to 7 iterations, which means that the same forward and backward recursions will be repeated 3 to 7 times, each with updated branch metric values. Since a probability is always smaller than 1 and its log value is always smaller than 0, $\alpha$, $\beta$ and $\gamma$ all have negative values. Moreover, every time $\gamma$ is updated by adding a newly-calculated soft-decoder output after every iteration, it becomes an even smaller number. In fixed point representation too small a value of $\gamma$ results in a loss of precision. Typically when 8 bits are used, the usable signal dynamic range is −255 to 0, while the total dynamic range is −255 to 255, i.e. half of the total dynamic range is wasted.

In a prior attempt to overcome this problem, the state metrics $\alpha$ and $\beta$ have been normalized at each state by subtracting the maximum state metric value for that time. However, this method results in a time delay as the maximum value is determined. Current turbo-decoders also require a great deal of memory in which to store all of the forward and reverse state metrics before soft decision values can be calculated.

An object of the present invention is to overcome the shortcomings of the prior art by increasing the speed and precision of the turbo decoder while better utilizing the dynamic range, lowering the gate count and minimizing memory requirements.

SUMMARY OF THE INVENTION

In accordance with the principles of the invention the quantities ${}_j(R_k,s_j',s)(j=0, 1)$ used in the recursion calculation employed in a turbo decoder are first normalized. This results in an increase in the dynamic range for a fixed point decoder.

According to the present invention there is provided a method of decoding a received encoded data stream having multiple states s, comprising the steps of:

recursively determining the value of at least one of the quantities $\alpha_k(s)$ and $\beta_k(s)$ defined as $$\alpha_k(s) = \log(Pr\{S_k = s \mid R_1^k\})$$

$$\beta_k(s) = \log\left(\frac{Pr\{R_{k+1}^N S_k = s\}}{Pr\{R_{k+1}^N \mid R_1^N\}}\right)$$

where $R_1^{\ k}$ represents received bits from time index 1 to k, and $S_k$ represents the state of an encoder at time index k, from previous values of $\alpha_k(s)$ or $\beta_k(s)$, and from quantities $\gamma'_j(R_k,s_j',s)(j=0, 1)$, where $\gamma'_j(R_k,s_j',s)$ $(j=0, 1)$ is a normalized value of $\gamma_j(R_k,s_j',s)(j=0, 1)$, which is defined as, $$\gamma_j(R_k s'_j, s)=\log(Pr(d_k=j, S_k=s, R_k|S_{k-1}=s'_j))$$

where Pr represents probability, $R_k$ represents received bits at time index k, and $d_k$ represents transmitted data at time k.

The invention also provides a decoder for a convolutionally encoded data stream, comprising:

a first normalization unit for normalizing the quantity $$\gamma_j(R_k s'_j, s)=\log(Pr(d_k=j, S_k=s, R_k|S_{k-1}=s'_j))$$

adders for adding normalized quantities $\gamma'_j(R_k,s_j',s)(j=0, 1)$ to quantities $\alpha_{k-1}(s_0')$, $\alpha_{k-1}(s_1')$, or $\beta_{k-1}(s_0')$, $\beta_{k-1}(s_1')$, where $$\alpha_k(s) = \log(Pr\{S_k = s \mid R_1^k\})$$

$$\beta_k(s) = \log\left(\frac{Pr\{R_{k+1}^N S_k = s\}}{Pr\{R_{k+1}^N \mid R_1^N\}}\right)$$

a multiplexer and log unit for producing an output $\alpha_k'(s)$, or $\beta_k'(s)$, and a second normalization unit to produce a desired output $\alpha_k(s)$, or $\beta_k(s)$.

The processor speed can also be increased by performing an Smax operation on the resulting quantities of the recursion calculation. This normalization is simplified with the Smax operation.

The present invention additionally relates to a method for decoding a convolutionally encoded codeword using a turbo decoder with x bit representation and a dynamic range of $2^x-1$ to $-(2^x-1)$, comprising the steps of:

a) defining a first trellis representation of possible states and transition branches of the convolutional codeword having a block length N, N being the number of received samples in the codeword;

b) initializing each starting state metric $\alpha_{-1}(s)$ of the trellis for a forward iteration through the trellis;

c) calculating branch metrics $\gamma_{k0}(s_0',s)$ and $\gamma_{k0}(s_1',s)$;

d) determining a branch metric normalizing factor;

e) normalizing the branch metrics by subtracting the branch metric normalizing factor from both of the branch metrics to obtain $\gamma_{k1}'(s_1',s)$ and $\gamma_{k0}'(s_0',s)$;

f) summing $\alpha_{k-1}(s_1')$ with $\gamma_{k1}'(s_1',s)$, and $\alpha_{k-1}(s_0')$ with $\gamma_{k0}'(s_0',s)$ to obtain a cumulated maximum likelihood metric for each branch;

g) selecting the cumulated maximum likelihood metric with the greater value to obtain $\alpha_k(s)$;

h) repeating steps c to g for each state of the forward iteration through the entire trellis;

i) defining a second trellis representation of possible states and transition branches of the convolutional codeword having the same states and block length as the first trellis;

j) initializing each starting state metric $\beta_{N-1}(s)$ of the trellis for a reverse iteration through the trellis;

k) calculating the branch metrics $\gamma_{k0}(s_0',s)$ and $\gamma_{k1}(s_1',s)$;

l) determining a branch metric normalization term;

m) normalizing the branch metrics by subtracting the branch metric normalization term from both of the branch metrics to obtain $\gamma_{k1}'(s_1',s)$ and $\gamma_{k0}'(s_0',s)$;

n) summing $\beta_{k+1}(s_1')$ with $\gamma_{k1}'(s_1',s)$, and $\beta_{k+1}(s_0')$ with $\gamma_{k0}'(s_0',s)$ to obtain a cumulated maximum likelihood metric for each branch;

o) selecting the cumulated maximum likelihood metric with the greater value as $\beta_k(s)$;

p) repeating steps k to o for each state of the reverse iteration through the entire trellis;

q) calculating soft decision values $P_1$ and $P_0$ for each state; and r) calculating a log likelihood ratio at each state to obtain a hard decision thereof.

Another aspect of the present invention relates to a method for decoding a convolutionally encoded codeword using a turbo decoder with x bit representation and a dynamic range of $2^x-1$ to $-(2^x-1)$, comprising the steps of:

a) defining a first trellis representation of possible states and transition branches of the convolutional codeword having a block length N, N being the number of received samples in the codeword;

b) initializing each starting state metric $\alpha_{-1}(s)$ of the trellis for a forward iteration through the trellis;

c) calculating the branch metrics $\gamma_{k0}(s_0',s)$ and $\gamma_{k1}(s_1',s)$;

summing $\alpha_{k-1}(s_1')$ with $\gamma_{k1}(s_1',s)$, and $\alpha_{k-1}(s_0')$ with $\gamma_{k0}(s_0',s)$ to obtain a cumulated maximum likelihood metric for each branch;

selecting the cumulated maximum likelihood metric with the greater value as $\alpha_k(s)$;

determining a forward normalizing factor, based on the values of $\alpha_{k-1}(s)$, to reposition the values of $\alpha_k(s)$ proximate the center of the dynamic range;

g) normalizing $\alpha_k(s)$ by subtracting the forward normalizing factor from each $\alpha_k(s)$;

h) repeating steps c to g for each state of the forward iteration through the entire trellis;

i) defining a second trellis representation of possible states and transition branches of the convolutional codeword having the same number of states and block length as the first trellis;

j) initializing each starting state metric $\beta_{N-1}(s)$ of the trellis for a reverse iteration through the trellis;

k) calculating the branch metrics $\gamma_{k0}(s_0',s)$ and $\gamma_{k1}(s_1',s)$;

l) summing $\beta_{k+1}(s_1')$ with $\gamma_{k1}(s_1',s)$, and $\beta_{k+1}(s_o')$ with $\gamma_{k0}(s_0',s)$ to obtain a cumulated maximum likelihood metric for each branch;

m) selecting the cumulated maximum likelihood metric with the greater value as $\beta_k(s)$;

n) determining a reverse normalizing factor, based on the value of $\beta_{k+1}(s)$, to reposition the values of $\beta_k(s)$ proximate the center of the dynamic range;

o) normalizing $\beta_k(s)$ by subtracting the reverse normalizing factor from each $\beta_k(s)$;

p) repeating steps k to o for each state of the reverse iteration through the entire trellis;

q) calculating soft decision values $P_1$ and $P_0$ for each state; and r) calculating a log likelihood ratio at each state to obtain a hard decision thereof.

Another aspect of the present invention relates to a method for decoding a convolutionally encoded codeword using a turbo decoder, comprising the steps of:

a) defining a first trellis representation of possible states and transition branches of the convolutional codeword having a block length N, N being the number of received samples in the codeword;

b) initializing each starting state metric $\alpha_{-1}(s)$ of the trellis for a forward iteration through the trellis;

c) calculating the branch metrics $\gamma_{k0}(s_0',s)$ and $\gamma_{k1}(s_1',s)$;

d) summing $\alpha_{k-1}(s_1')$ with $\gamma_{k1}(s_1',s)$, and $\alpha_{k-1}(s_0')$ with $\gamma_{k0}(s_0',s)$ to obtain a cumulated maximum likelihood metric for each branch;

e) selecting the cumulated maximum likelihood metric with the greater value as $\alpha_k(s)$;

f) repeating steps c to e for each state of the forward iteration through the entire trellis;

g) defining a second trellis representation of possible states and transition branches of the convolutional codeword having the same number of states and block length as the first trellis;

h) initializing each starting state metric $\beta_{N-1}(s)$ of the trellis for a reverse iteration through the trellis;

i) calculating the branch metrics $\gamma_{k0}(s_0',s)$ and $\gamma_{k1}(s_1',s)$;

i) summing $\beta_{k+1}(s_1')$ with $\beta_{k1}(s_1',s)$, and $\beta_{k+1}(s_o')$ with $\beta_{k0}(s_0',s)$ to obtain a cumulated maximum likelihood metric for each branch;

j) selecting the cumulated maximum likelihood metric with the greater value as $\beta_k(s)$;

k) repeating steps i to k for each state of the reverse iteration through the entire trellis;

m) calculating soft decision values $P_0$ and $P_1$ for each state; and n) calculating a log likelihood ratio at each state to obtain a hard decision thereof;

wherein steps a to f are executed simultaneously with steps g to l; and wherein step m includes:

storing values of $\alpha_{-1}(s)$ to at least $\alpha_{N/2-2}(s)$, and $\beta_{N-1}(s)$ to at least $\beta_{N/2}(s)$ in memory; and sending values of at least $\alpha_{N/2-1}(s)$ to $\alpha_{N-2}(s)$, and at least $\beta_{N/2-1}(s)$ to $\beta_0(s)$ to probability calculator means as soon as the values are available, along with required values from memory to calculate the soft decision values $P_{k0}$ and $P_{k1}$;

whereby all of the values for $\alpha(s)$ and $\beta(s)$ need not be stored in memory before some of the soft decision values are calculated.

The apparatus according to the present invention is defined by a turbo decoder system with x bit representation for decoding a convolutionally encoded codeword comprising:

receiving means for receiving a sequence of transmitted signals;

first trellis means with block length N defining possible states and transition branches of the convolutionally encoded codeword;

first decoding means for decoding said sequence of signals during a forward iteration through said first trellis, said first decoding means including:

branch metric calculating means for calculating branch metrics $\gamma_{k0}(s_0',s)$ and $\gamma_{k1}(s_1',s)$;

branch metric normalizing means for normalizing the branch metrics to obtain $\gamma_{k1}'(s_1',s)$ and $\gamma_{k0}'(s_0',s)$;

summing means for adding state metrics $\alpha_{k-1}(s_1')$ with $\gamma_{k1}'(s_1',s)$, and state metrics $\alpha_{k-1}(s_0')$ with $\gamma_{k0}'(s_0',s)$ to obtain cumulated metrics for each branch; and selecting means for choosing the cumulated metric with the greater value to obtain $\alpha_k(s)$;

second trellis means with block length N defining possible states and transition branches of the convolutionally encoded codeword;

second decoding means for decoding said sequence of signals during a reverse iteration through said trellis, said second decoding means including:

branch metric calculating means for calculating branch metrics $\gamma_{k0}(s_0',s)$ and $\gamma_{k1}(s_1',s)$;

branch metric normalizing means for normalizing the branch metrics to obtain $\gamma_{k1}'(s_1',s)$ and $\gamma_{k0}'(s_0',s)$;

summing means for adding state metrics $\beta_{k+1}(s_1')$ with $\gamma_{k1}'(s_1',s)$, and state metrics $\beta_{k+1}(s_o')$ with $\gamma_{k0}'(s_0',s)$ to obtain cumulated metrics for each branch; and selecting means for choosing the cumulated metric with the greater value to obtain $\beta_k(s)$;

soft decision calculating means for determining the soft decision values $P_{k0}$ and $P_{k1}$; and LLR calculating means for determining the log likelihood ratio for each state to obtain a hard decision therefor.

Another feature of the present invention relates to a turbo decoder system, with x bit representation having a dynamic range of $2^x-1$ to $-(2^x-1)$, for decoding a convolutionally encoded codeword, the system comprising:

receiving means for receiving a sequence of transmitted signals:

first trellis means defining possible states and transition branches of the convolutionally encoded codeword;

first decoding means for decoding said sequence of signals during a forward iteration through said first trellis, said first decoding means including:

branch metric calculating means for calculating branch metrics $\gamma_{k0}(s_0',s)$ and $\gamma_{k1}(s_1',s)$;

summing means for adding state metrics $\alpha_{k-1}(s_1')$ with $\gamma_{k1}'(s_1',s)$, and state metrics $\alpha_{k-1}(s_0')$ with $\gamma_{k0}'(s_0',s)$ to obtain cumulated metrics for each branch; and selecting means for choosing the cumulated metric with the greater value to obtain $\alpha_k(s)$;

forward state metric normalizing means for normalizing the values of $\alpha_k(s)$ by subtracting a forward state normalizing factor, based on the values of $\alpha_{k-1}(s)$, from each $\alpha_k(s)$ to reposition the value of $\alpha_k(s)$ proximate the center of the dynamic range;

second trellis means with block length N defining possible states and transition branches of the convolutionally encoded codeword;

second decoding means for decoding said sequence of signals during a reverse iteration through said trellis, said second decoding means including:

branch metric calculating means for calculating branch metrics $\gamma_{k0}(s_0',s)$ and $\gamma_{k1}(s_1',s)$;

summing means for adding state metrics $\beta_{k+1}(s_1')$ with $\gamma_{k1}'(s_1',s)$, and state metrics $\beta_{k+1}(s_o')$ with $\gamma_{k0}'(s_0',s)$ to obtain cumulated metrics for each branch;

selecting means for choosing the cumulated metric with the greater value to obtain $\beta_k(s)$; and wherein the second rearward state metric normalizing means for normalizing the values of $\beta_k(s)$ by subtracting from each $\beta_k(s)$ a rearward state normalizing factor, based on the values of $\beta_{k+1}(s)$, to reposition the values of $\beta_k(s)$ proximate the center of the dynamic range;

soft decision calculating means for calculating the soft decision values $P_{k0}$ and $P_{k1}$; and LLR calculating means for determining the log likelihood ratio for each state to obtain a hard decision therefor.

Yet another feature of the present invention relates to a turbo decoder system for decoding a convolutionally encoded codeword comprising:

receiving means for receiving a sequence of transmitted signals:

first trellis means with block length N defining possible states and transition branches of the convolutionally encoded codeword;

first decoding means for decoding said sequence of signals during a forward iteration through said first trellis, said first decoding means including:

branch metric calculating means for calculating branch metrics $\gamma_{k0}(s_0',s)$ and $\gamma_{k1}(s_1',s)$;

summing means for adding state metrics $\alpha_{k-1}(s_1')$ with $\gamma_{k1}'(s_1',s)$, and state metrics $\alpha_{k-1}(s_0')$ with $\gamma_{k0}'(s_0',s)$ to obtain cumulated metrics for each branch; and selecting means for choosing the cumulated metric with the greater value to obtain $\alpha_k(s)$;

second trellis means with block length N defining possible states and transition branches of the convolutionally encoded codeword;

second decoding means for decoding said sequence of signals during a reverse iteration through said trellis, said second decoding means including:

branch metric calculating means for calculating branch metrics $\gamma_{k0}(s_0',s)$ and $\gamma_{k1}(s_1',s)$;

summing means for adding state metrics $\beta_{k+1}(s_1')$ with $\gamma_{k1}'(s_1',s)$, and state metrics $\beta_{k+1}(s_o')$ with $\gamma_{k0}'(s_0',s)$ to obtain cumulated metrics for each branch; and selecting means for choosing the cumulated metric with the greater value to obtain $\beta_k(s)$;

soft decision calculating means for determining soft decision values $P_{k0}$ and $P_{k1}$; and LLR calculating means for determining the log likelihood ratio for each state to obtain a hard decision therefor;

wherein the soft decision calculating means includes:

memory means for storing values of $\alpha_{-1}(s)$ to at least $\alpha_{N/2-2}(s)$, and $\beta_{N-1}(s)$ to at least $\beta_{N/2}(s)$; and probability calculator means for receiving values of at least $\alpha_{N/2-1}(s)$ to $\alpha_{N-2}(s)$, and at least $\beta_{N/2-1}(s)$ to $\beta_0(s)$ as soon as the values are available, along with required values from memory to calculate the soft decision values;

whereby all of the values for $\alpha(s)$ and $\beta(s)$ need not be stored in memory before some soft decision values are calculated.

The invention now will be described in greater detail with reference to the accompanying drawings, which illustrate a preferred embodiment of the invention, wherein:

DETAILED DESCRIPTION OF THE PREFERRED EMBODIMENTS

Figure 1:
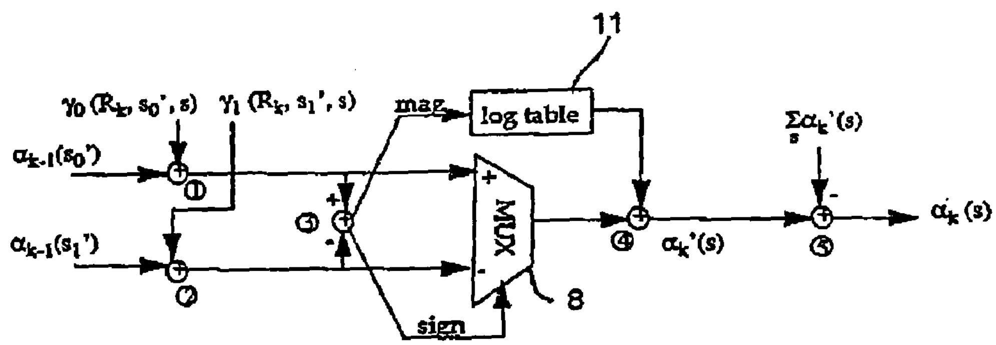
FIG. 1 is a block diagram of a standard module for the computation of the metrics and of the maximum likelihood path.

With reference to FIG. 1, a traditional turbo decoder system for decoding a convolutional encoded codeword includes an Add-Compare-Select (ACS) unit. The ADD function is carried out by summators 1 and 2 which, respectively, add state metric $_{k-1}(s_0')$ to branch metric $\gamma_0(R_k,s_0',s)$ and state metric $_{k-1}(s_1')$ to branch metric $\gamma_1(R_k,s_1',s)$ to obtain two cumulated metrics. The COMPARE to determine which of the aforementioned cumulated metrics is greater, is performed by substractor 3 which subtracts the second sum $_{k-1}(s_1')\gamma_1(s_1',s)$ from the first sum $_{k-1}(s_0')\gamma_0(s_0',s)$. In FIG. 1, the output of adder 3 is epread into two directions: its sign controls the MUX 8 and its magnitude controls a small log table 11. In practice, very few bits are need for the magnitude. The sign of the difference between the cumulated metrics indicates which one is greater, i.e. if the difference is negative $\alpha_{k-1}(s_1')\gamma_1(s_1',s)$ is greater. The sign of the difference controls a 2 to 1 multiplexer 8, which is used to SELECT the survivor cumulated metric having the greater sum. The magnitude of the difference between the two cumulated metrics acts as a weighting coefficient, since the greater the difference the more likely the correct choice was made between the two branches. The magnitude of the difference also is supplied to a long table unit 11 which produces a corresponding correction and applies it to the summator 4. The magnitude of the difference dictates the size of a correction factor, which is added to the selected cumulated metric at summator 4. The correction factor is necessary to account for an error resulting from the MAX operation. In this example, the correction factor is approximated in the log table 11, although other methods of providing the correction factor are possible, such as that disclosed in the Aug. 6, 1998 edition of Electronics Letters in an article entitled "Simplified MAP algorithm suitable for implementation of turbo decoders", by W. J. Gross and P. G. Gulak. The resulting corrected cumulated metrics $\alpha'_k(s)$ are then normalized by subtracting therefrom the state metric normalization term $(\Sigma\alpha_k'(s))$ which is the maximum value of $\alpha'_k(s)$, using subtractor 5. The resultant value is $\alpha_k(s)$. This forward iteration is repeated for the full length of the trellis. The same process is repeated for the reverse iteration using the reverse state metrics $\beta_k(s)$ in place of the state metric $\alpha_k(s)$ as is well known in the prior art.

As will be understood by one skilled in the art, the circuit shown in FIG. 1 performs the computation $$\alpha_k(s) = \log(Pr\{S_k = s \mid R_1^k\})$$

$$\beta_k(s) = \log\left(\frac{Pr\{R_{k+1}^N S_k = s\}}{Pr\{R_{k+1}^N \mid R_1^N\}}\right)$$

where $R_1{}^k$ represents the received information bits and parity bits from time index 1 to k[1], and $S_k$ represents the encode state at time index k.

A similar structure can also be applied to the backward recursion of $\beta_k$.

In FIG. 1, the value α at state s and time instant k ($\alpha_k(s)$ is related with two previous state values which are $_{k-1}(s_0')$ and $_{k-1}(s_1')$ at time instant k−1. $\gamma_j(R_k,s_j',s)$ j=0, 1 represents the information bit defined as $$\gamma_j(R_k,s'_j,s)=\log(Pr(d_k=j,S_k=s,R_k|S_{k-1}=s'_j))$$

where $R_k$ represents the received information bits and parity bits at time index k and $d_k$ represents the transmitted information bit at time index k[1].

A trellis diagram (FIGS. 3 & 4) is the easiest way to envision the iterative process performed by the ACS unit shown in FIG. 1. For the example given in FIGS. 3 and 4, the memory length (or constraint length) of the algorithm is 3 which results in $2^3$=8 states (i.e. 000, 001 . . . 111). The block length N of the trellis corresponds to the number of samples taken into account for the decoding of a given sample. An arrow represents a transition branch from one state to the next given that the next input bit of information is a 0 or a 1. The transition is dependent upon the convolutional code used by the encoder. To calculate all of the soft decision values $\alpha_k$, $\alpha_{-1}(s_0)$ is given an initial value of 0, while the remaining values $\alpha_{-1}(s_t)$ (t=1 to 7) are given a sufficiently small initial value, e.g. −128. After the series of data bits making up the message are received by the decoder, the branch metrics $\gamma_{k0}$ and $\gamma_{k1}$ are calculated in the known way. The iterative process then proceeds to calculate the state metrics $\alpha_k$. Similarly the reverse iteration can be enacted at the same time or subsequent to the forward iteration. All of the initial values for $\beta_{N-1}$ are set at equal value, e.g. 0.

Once all of the soft decision values are determined and the required number of iterations are executed the log-likelihood ratio (LLR) can be calculated according to the following relationships:

$$LLR = \log\frac{P(u_k = 1 \mid R_K)}{P(u_k = -1 \mid R_K)}$$

$$= \log\frac{\sum a_{k-1}(s')b_k(s)c_k(s', s) \text{ for } u_k = +1}{\sum a_{k-1}(s')b_k(s)c_k(s', s) \text{ for } u_k = -1}$$

$R_K$ = Received signals $\alpha = \ln(a)$ $\beta = \ln(b)$ $\gamma = \ln(c)$ $u_k$ = bit associated with $k_{th}$ bit $$\text{associated with } k_{th} \text{ bit} = \text{Max}\,(\beta_k + \alpha_{k-1} + \gamma_k) - \text{Max}(\beta_k + \alpha_{k-1} + \gamma_k)$$

$u_k = 1$ $u_k = -1$ $= P_{k1} - P_{k0}$

Figure 3:
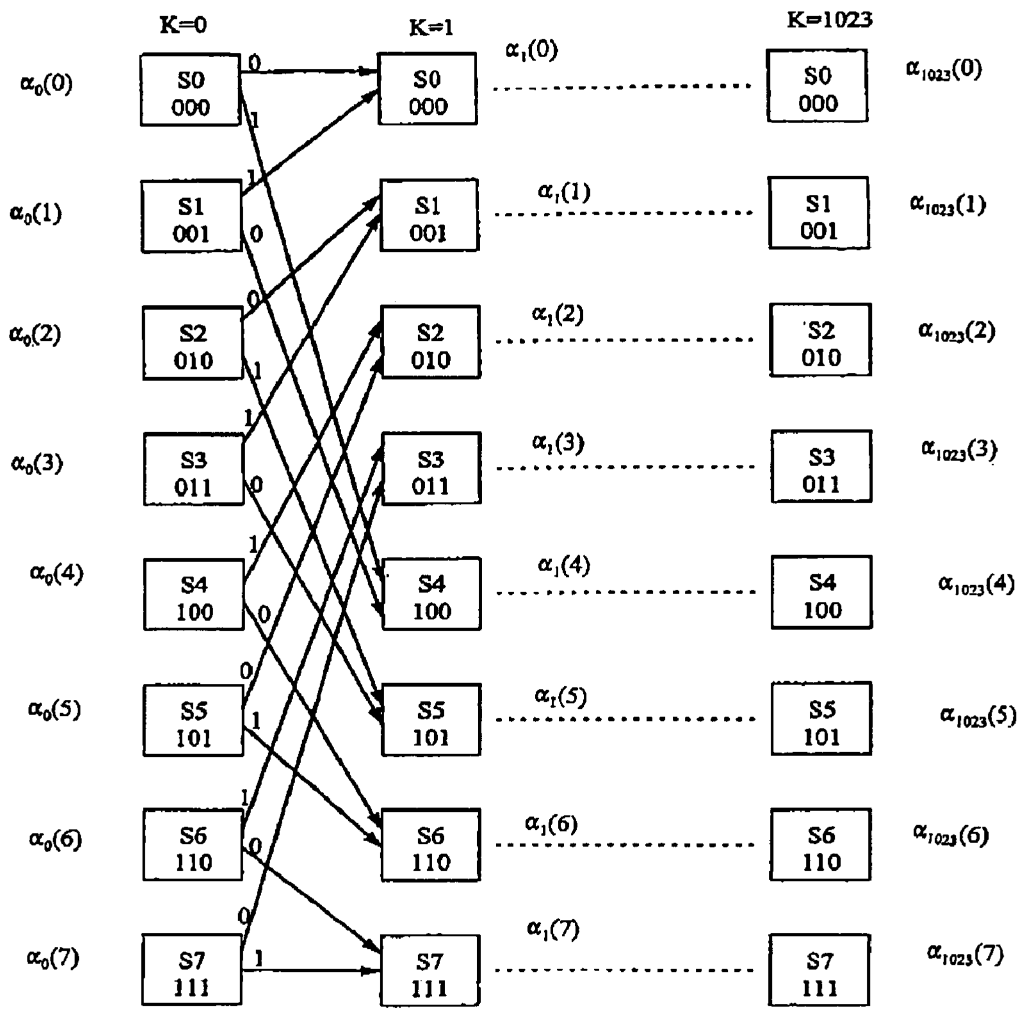
FIG. 3 is an example of a trellis diagram representation illustrating various states and branches of a forward iteration.
Figure 4:
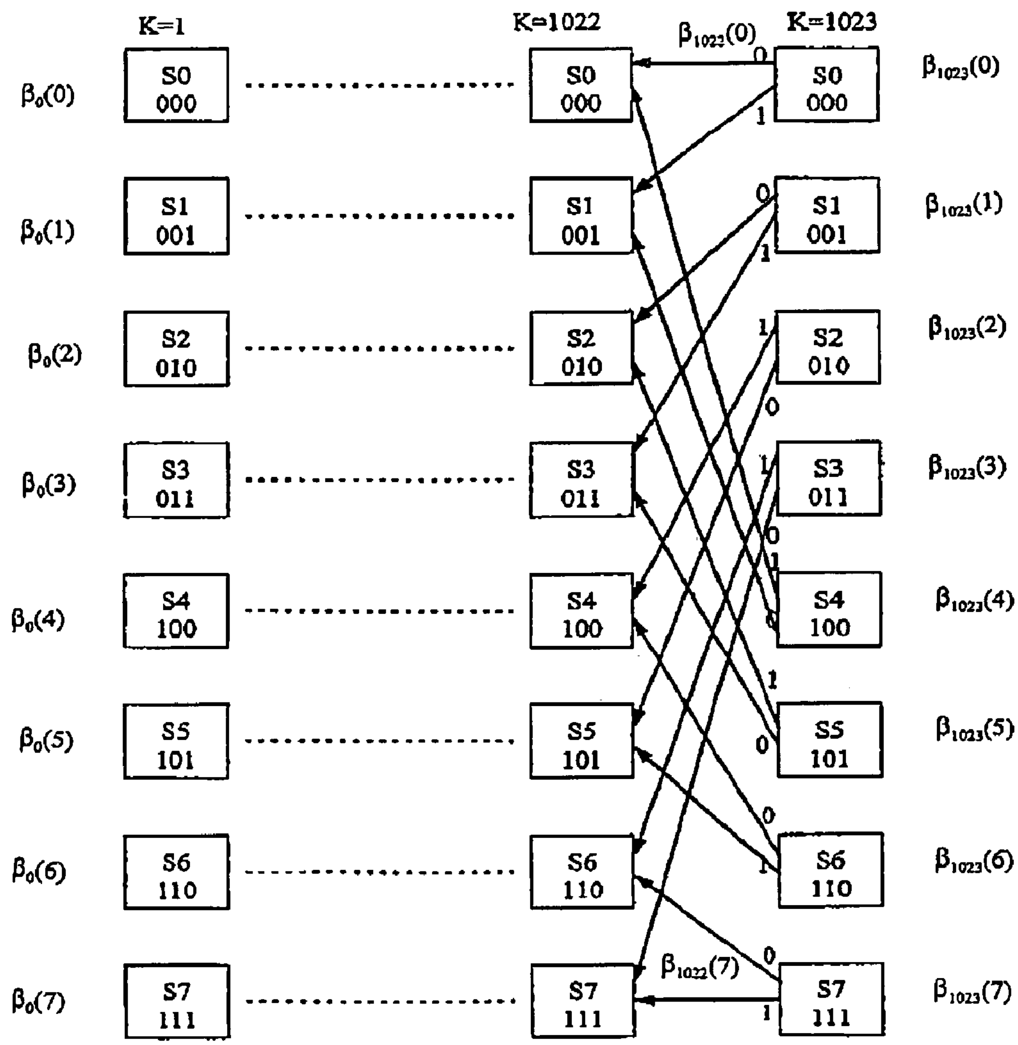
FIG. 4 is an example of a trellis diagram representation illustrating various states and branches of a reverse iteration.
Figure 5:
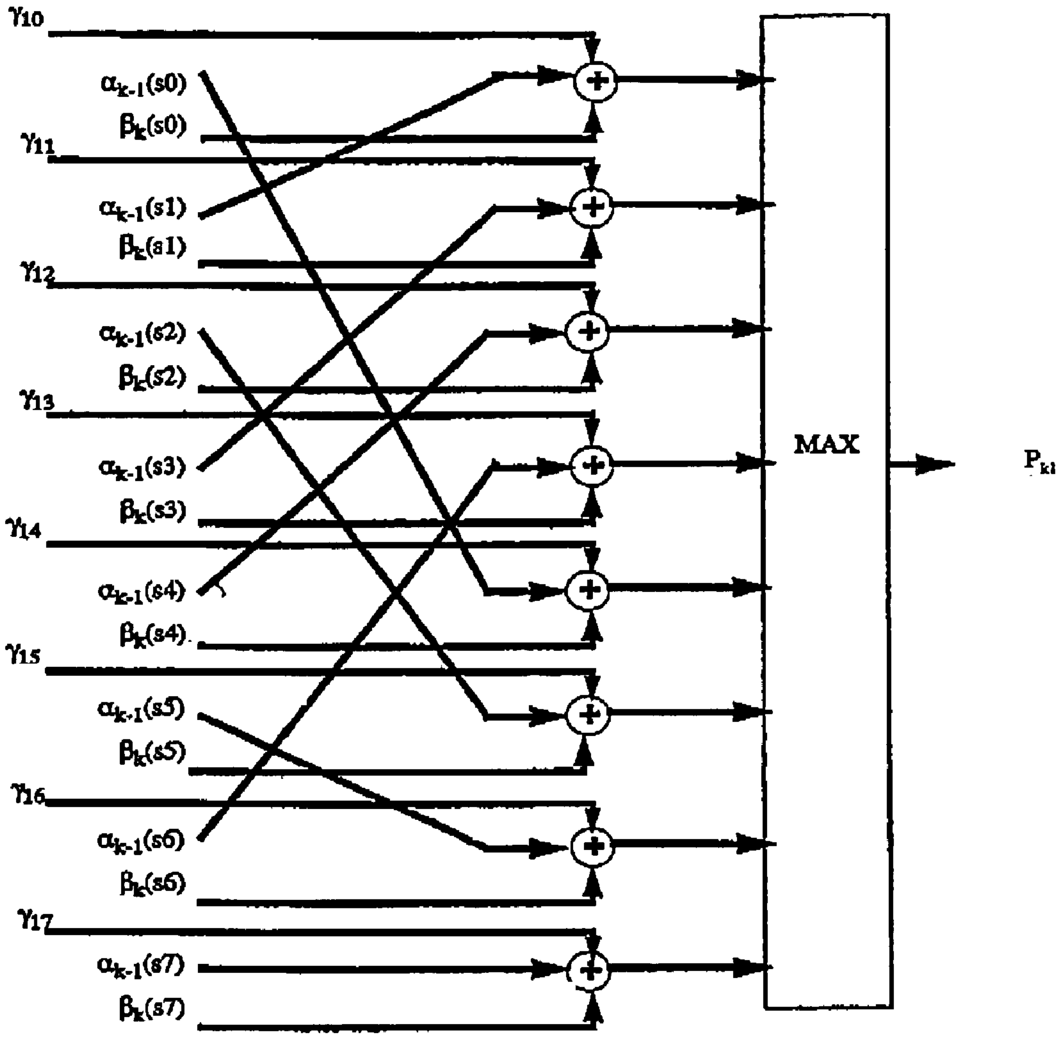
FIG. 5 is an example of a flow chart representation of the calculations for $P_{k1}$ according to the present invention.
Figure 6:
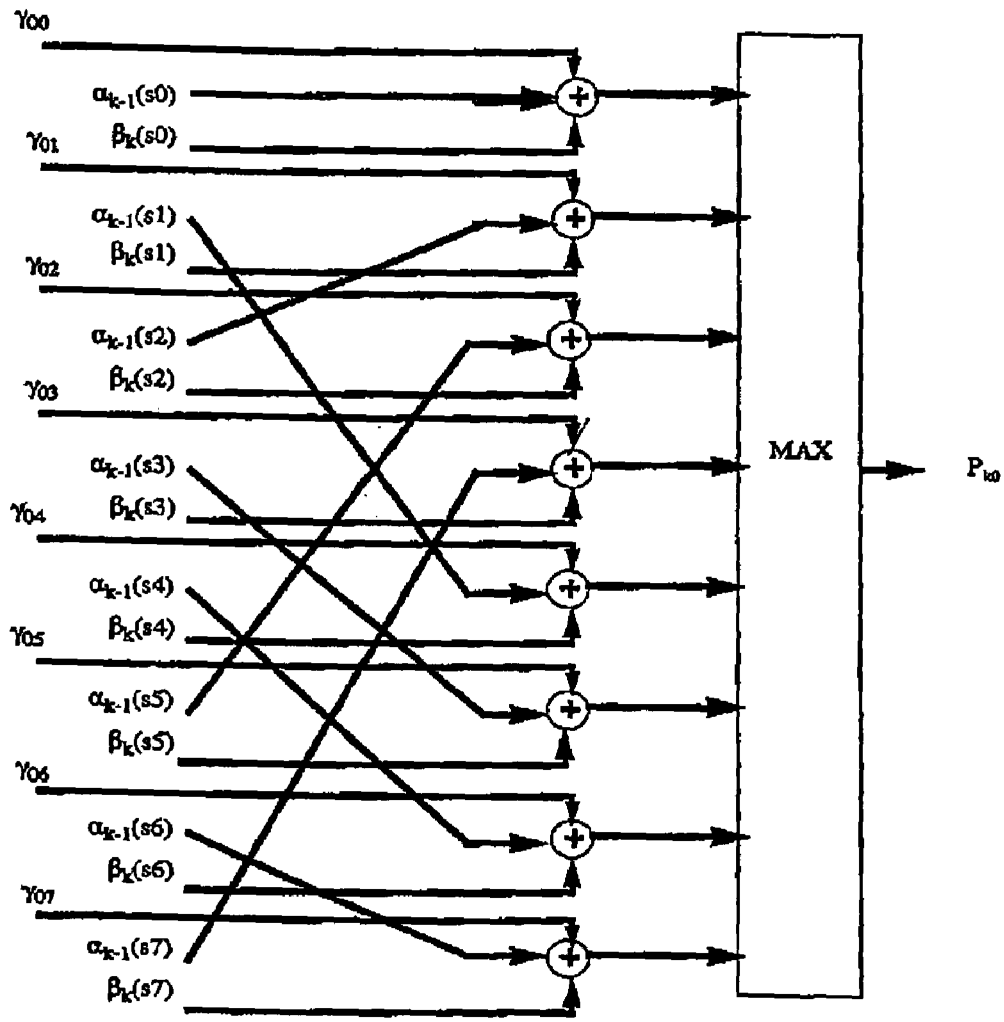
FIG. 6 is an example of a flow chart representation of the calculations for $P_{k0}$ according to the present invention.

FIG. 5 and FIG. 6 illustrate flow charts representing the calculation of $P_{k1}$, and $P_{k0}$ respectively based on the forward and backward recursions illustrated in FIGS. 3 and 4.

In the decoder shown in FIG. 1, the time required for $\Sigma_s\alpha_k'(s)$ to be calculated can be unduly long if the turbo encoder has a large number of states s. A typical turbo code has 8 or 16 states, which means that 7 0r 25 adders are required to compute $\Sigma_s\alpha_k'(s)$. Even an optimum parallel structure requires 15 adders and a 4 adder delay for a 16 state turbo decoder.

Also, a typical turbo decoder requires at least 3 to 7 iterations, which means that the same α and β recursion will be repeated 3 to 7 times, each with updated $\gamma_j(R_k,s_0',s)$(j==0, 1) values. Since the probability is always smaller than 1 and its log value is always smaller than zero, α, β are γ are all negative values. The addition of any two negative values will make the output more negative. When γ is updated by adding a newly calculated soft decoder output, which is also a negative value, γ becomes smaller and smaller after each iteration. In fixed point representation, too small value for γ means loss of precision. In the worst case scenario, the decoder could be saturated at the negative overflow value, which is 0×80 for b but implementation.

Figure 2:
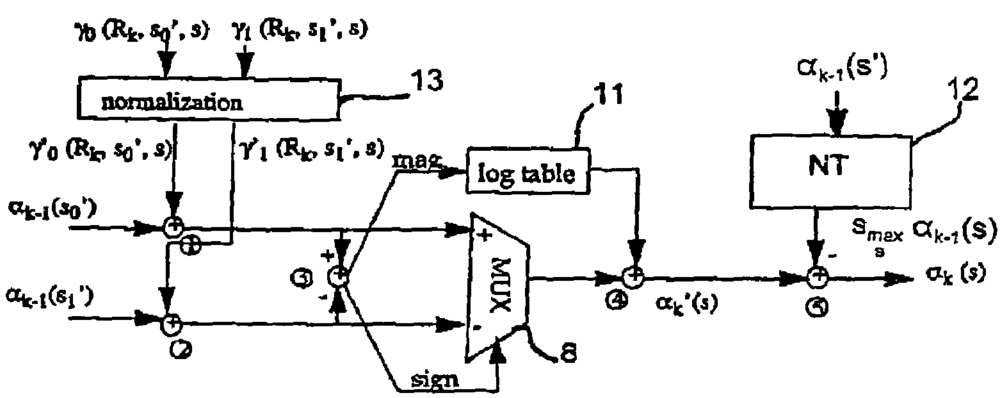
FIG. 2 is a block diagram of a module for the computation of forward and reverse state metrics according to the present invention.

With reference to FIG. 2, the decoder in accordance with the principles of this invention includes some of the elements of the prior art decoder along with a branch metric normalization system 13. To ensure that the values of $\gamma_0$ and $\gamma_1$ do not become too small and thereby lose precision, the branch metric normalization system 13 subtracts a normalization factor from both branch metrics. This normalization factor is selected based on the initial values of $\gamma_0$ and $\gamma_1$ to ensure that the values of the normalized branch metrics $\gamma_0'$ and $\gamma_1'$ are close to the center of the dynamic range i.e. 0.

The following is a description of the preferred branch metric normalization system. Initially, the branch metric normalization system 13 determines which branch metric $\gamma_0$ or $\gamma_1$ is greater. Then, the branch metric with the greater value is subtracted from both of the branch metrics, thereby making the greater of the branch metrics 0 and the smaller of the branch metrics the difference. This relationship can also be illustrated using the following equation $\gamma_0'=0$, if $\gamma_0>\gamma_1$, or $\gamma_0-\gamma_1$, otherwise $\gamma_1'=0$, if $\gamma_1\geqq\gamma_0$ or $\gamma_1-\gamma_0$ otherwise Using this implementation, the branch metrics $\gamma_0$ and $\gamma_1$ are always normalized to 0 in each turbo decoder iteration and the dynamic range is effectively used thereby avoiding ever increasingly smaller values.

In another embodiment of the present invention in an effort to utilize the entire dynamic range and decrease the processing time of the state metric normalization term, e.g. the maximum value of $\alpha_k(s)$, is replaced by the maximum value of $\alpha_{k-1}(s)$, which is pre-calculated using the previous state $\alpha_{k-1}(s)$. This alleviates any delay between summator 4 and subtractor 5 while the maximum value of $\alpha_k(s)$ is being calculated.

Alternatively, according to another embodiment of the present invention, the state metric normalization term is replaced by a variable term NT, which is dependent upon the value of $\alpha_{k-1}(s)$ (see Box 12 in FIG. 2). The value of NT is selected to ensure that the values of the state metrics are moved closer to the center of the dynamic range, i.e. 0 in most cases. Generally speaking, if the decoder has x bit representation, when any value of $\alpha_{k-1}(s)$ is greater than zero, then the variable term NT is a small positive number, e.g. between 1 and 8. If all values of $\alpha_{k-1}(s)$ are less than 0 and any one value of $\alpha_{k-1}(s)$ is greater than $-2^{x-2}$, then the variable term NT is about $-2^{x-3}$, i.e. $-2^{x-3}$ and is added to all of the values of $\alpha_k(s)$. If all values of $\alpha_{k-1}(s)$ are less than $-2^{x-2}$, then the variable term NT is the bit OR value of each value of $\alpha_{k-1}(s)$.

For example in 8 bit representation:

if any of $\alpha_{k-1}(s)$ (s=1, 2 . . . M) is greater than zero, then the NT is 4, i.e. 4 is subtracted from all of the $\alpha_k(s)$;

if all of $\alpha_{k-1}(s)$ are less than 0 and any one of $\alpha_{k-1}(s)$ is greater than −64, then the NT is −31, i.e. 31 is added to all of the $\alpha_k(s)$;

if all of $\alpha_{k-1}(s)$ are less than −64, then the NT is the bit OR value of each $\alpha_{k-1}(s)$.

In other words, whenever the values of $\alpha_{k-1}(s)$ approach the minimum value in the dynamic range, i.e. $-(2^x-1)$, they are adjusted so that they are closer to the center of the dynamic range.

The same values can be used during the reverse iteration.

This implementation is much simpler than calculating the maximum value of M states. However, it will not guarantee that $\alpha_k(s)$ and $\beta_k(s)$ are always less than 0, which a log-probability normally defines. However, this will not affect the final decision of the turbo-decoder algorithm. Moreover, positive values of $\alpha_k(s)$ and $\beta_k(s)$ provide an advantage for the dynamic range expansion. By allowing $\alpha_k(s)$ and $\beta_k(s)$ to be greater than 0, by normalization, the other half of the dynamic range (positive numbers), which would not otherwise be used, will be utilized.

Figure 7:
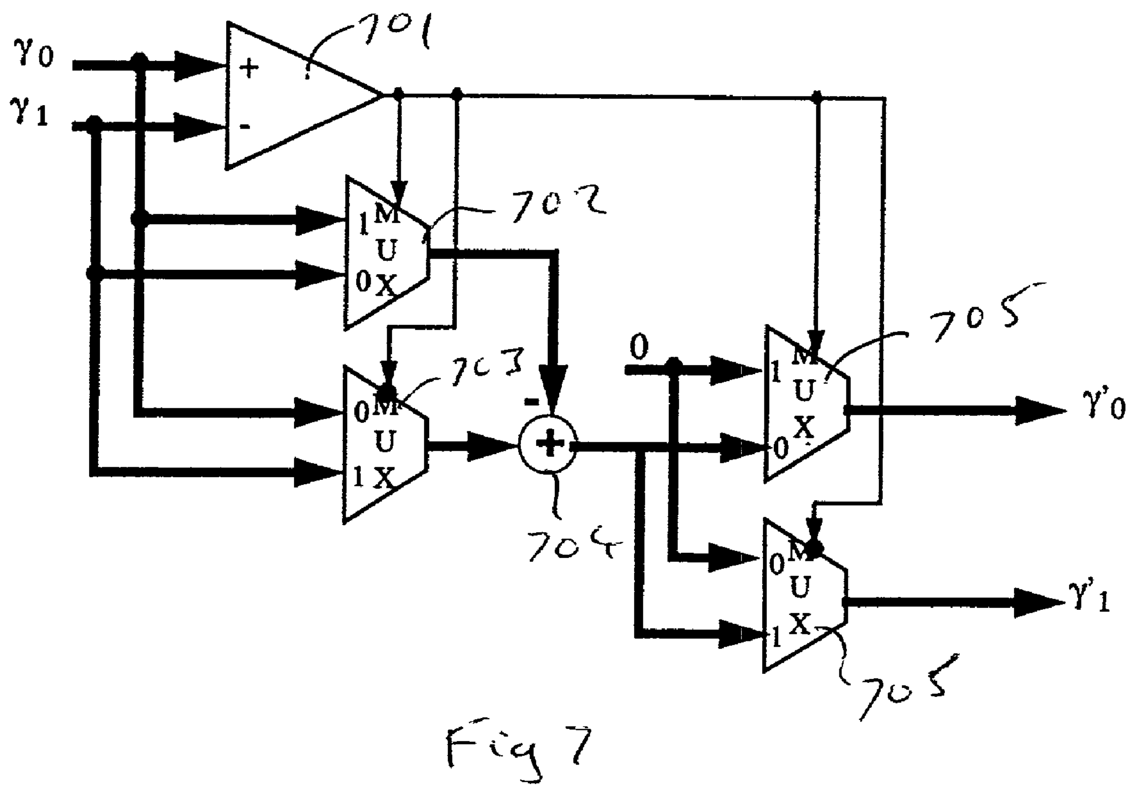
FIG. 7 is a block diagram of a circuit for performing normalization.

FIG. 7 shows a practical implementation of the normalization function. $\gamma_0$, $\gamma_1$ are input two comparator 701, and Muxes 702, 703 whose outputs are connected to a subtractor 704. Output Muxes produced the normalized outputs $\gamma'_0$, $\gamma'_1$. This ensures $\gamma'_0$, $\gamma'_1$ that are always normlalized to zero in each turbo decoder iteration and the dynamic range is effectively used to avoid the values becoming smaller and smaller.

In FIG. 2, the normalization term is replaced with the maximum value of $\alpha_{k-1}(s)$ which can be precalculated $\alpha_{k-1}(s)$. There unlike the situation described with reference to FIG. 1, no wait time is required between adder 4 and adder 5.

Figure 8:
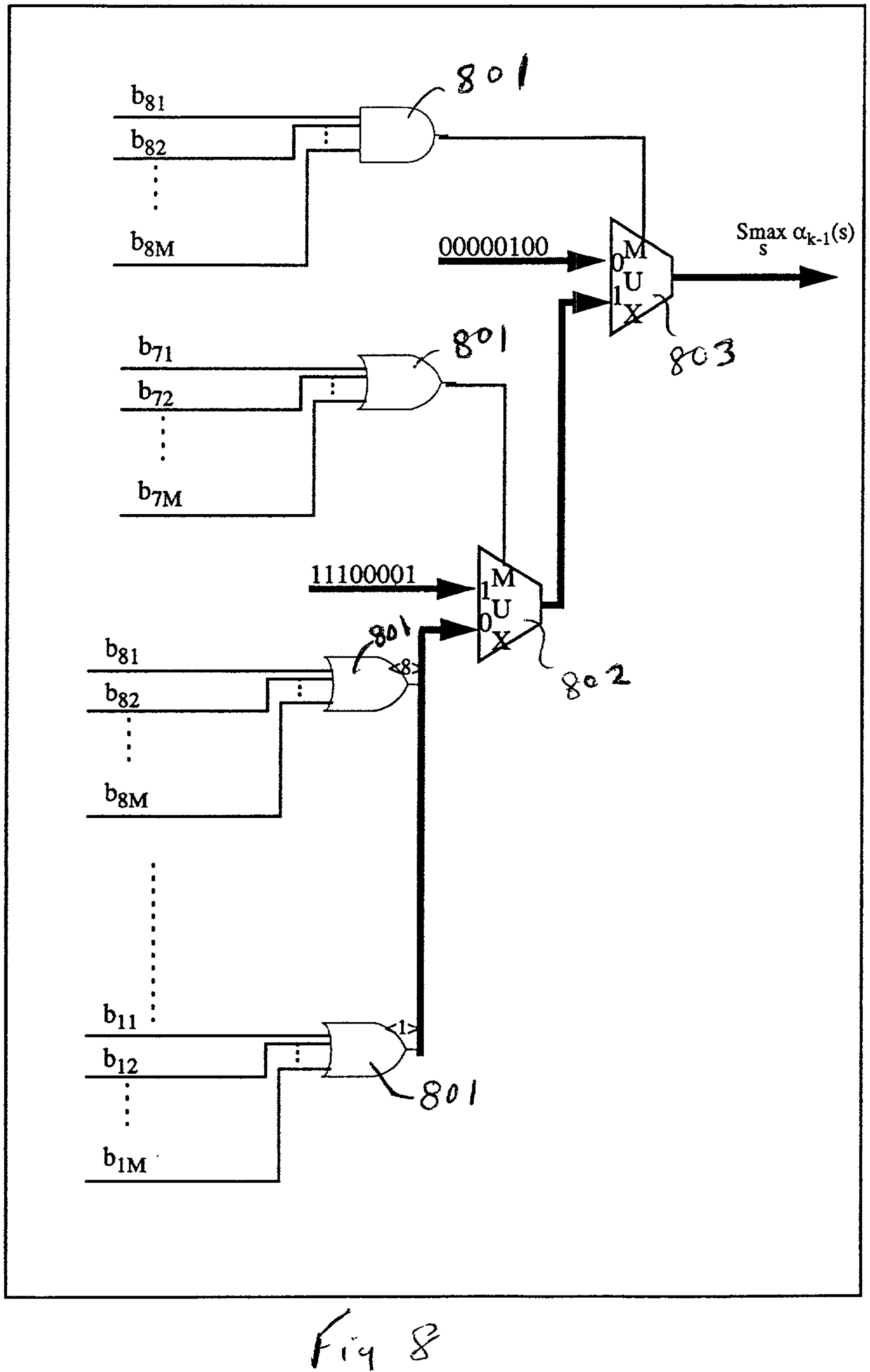
FIG. 8 is a block diagram of a circuit for calculating $S_{max}$.

To further simplify the operation, "Smax" is used to replace the true "max" operation as shown in FIG. 8. In FIG. 8, $b_{nm}$ represents the $n^{th}$ bit of $\alpha_{k-1}(m)$ (i.e. the value of $\alpha_{k-1}$ at state s=m. In FIG. 8, the bits $b_{nm}$ are fed through OR gates 801 to Muxes 802, 803, which produce the desired output $S_{max}\ \alpha_{k-1}(s)$. FIG. 8 shows represents three cases for 8 bit fixed point implementation.

If any of $\alpha_{k-1}(s=1, 2, \ldots M)$ is larger than zero, the Smax output will take a value 4 (0×4), which means that 4 should be subtracted from all $\alpha_k(s)$.

If all $\alpha_{k-1}(s)$ are smaller than zero and one of $\alpha_{k-1}(s)$ is larger than −64, the Smax will take a value −31 (0xe1), which means that 31 should be added to all $\alpha_k(s)$.

If all $\alpha_{k-1}(s)$ are smaller than −64, the Smax will take the bit OR value of all $\alpha_{k-1}(s)$.

The novel implementation is much simpler than the prior art technique of calculating the maximum value of M states, but it will not guarantee that $\alpha_k(s)$ is always smaller than zero. This does not affect the final decision in the turbo-decoder algorithm, and the positive value of $\alpha_k(s)$ can provide an extra advantage for dynamic range expansion. If $\alpha_k(s)$ are smaller than zero, only half of the 8-bit dynamic range is used. By allowing $\alpha_k(s)$ to be larger than zero with appropriate normalization, the other half of the dynamic range, which would not normally be used, is used.

A similar implementation can be applied to the $\beta_k(s)$ recursion calculation.

By allowing the log probability $\alpha_k(s)$ to be a positive number with appropriate normalization, the decoder performance is not affected and the dynamic range can be increased for fixed point implementation. The same implementation for forward recursion can be easily implemented for backward recursion.

Current methods using soft decision making require excessive memory to store all of the forward and the reverse state metrics before soft decision values $P_{k0}$ and $P_{k1}$ can be calculated. In an effort to eliminate this requirement the forward and backward iterations are performed simultaneously, and the $P_{k1}$ and $P_{k0}$ calculations are commenced as soon as values for $\beta_k$ and $\alpha_{k-1}$ are obtained. For the first half of the iterations the values for $\alpha_{-1}$ to at least $\alpha_{N/2-2}$, and $\beta_{N-1}$ to at least $\beta_{N/2}$ are stored in memory, as is customary. However, after the iteration processes overlap on the time line, the newly-calculated state metrics can be fed directly to a probability calculator as soon as they are determined along with the previously-stored values for the other required state metrics to calculate the $P_{k0}$, the $P_{k1}$. Any number of values can be stored in memory, however, for optimum performance only the first half of the values should be saved. Soft and hard decisions can therefore be arrived at faster and without requiring an excessive amount of memory to store all of the state metrics. Ideally two probability calculators are used simultaneously to increase the speed of the process. One of the probability calculators utilizes the stored forward state metrics and newly-obtained backward state metrics $\beta_{N/2-2}$ to $\beta_0$. This probability calculator determines a $P_{k0\ low}$ and a $P_{k1\ low}$. Simultaneously, the other probability calculator uses the stored backward state metrics and newly-obtained forward state metrics $\alpha_{N/2-1}$ to $\alpha_{N-2}$ to determine a $P_{k1\ high}$ and a $P_{k0\ high}$.

What is claimed is:

1. A method of decoding a received convolutionally encoded data stream having multiple states s, the data stream having been encoded by an encoder, comprising the steps of:

deriving normalized values $\gamma'_j(R_k,s_j',s)(j=0, 1)$ of branch metrics $\gamma_j(R_k,s_j',s)(j=0, 1)$, which are defined as $$\gamma_j(R_k,s_j',s)=\log(Pr(d_k=j,S_k=s,R_k|S_{k-1}=s_j'))$$

and recursively determining values of forward state metrics $\alpha_k(s)$ and reverse state metric $\beta_k(s)$ defined as $$\alpha_k(s)=\log(Pr\{S_k=s\mid R_1^k\})$$

$$\beta_k(s)=\log\left(\frac{Pr\{R_{k+1}^N S_k=s\}}{Pr\{R_{k+1}^N\mid R_1^N\}}\right)$$

from the normalized values $\gamma'_j(R_k,s_j',s)(j=0, 1)$ and previous values $\alpha_{k-1}(s')$ of forward state metrics $\alpha_k(s)$ and future values $\beta_{k+1}(s')$ of reverse state metrics $\beta_k(s)$, where Pr represents probability, $R_1^k$ represents received bits from time index 1 to k, $S_k$ represents the state of the encoder at time index k, $R_k$ represents received bits at time index k, and $d_k$ represents transmitted data at time k.

2. A method as claimed in claim 1, wherein the step of recursively determining the values of the state metrics $\alpha_k(s)$ and $\beta_k(s)$ uses as said previous values of $\alpha_k(s)$ the values $\alpha_{k-1}(s_0')$, $\alpha_{k-1}(s_1')$ at time k−1, and as said future values of $\beta_k(s)$ the values $\beta_{k+1}(s_0')$, $\beta_{k+1}(s_1')$ at time k+1.

3. A method as claimed in claim 1, wherein the step of recursively determining the values of the state metrics $\alpha_k(s)$ and $\beta_k(s)$ includes the step of adding said normalized values $\gamma'_j(R_k,s_j',s)(j=0, 1)$ to said previous and future values $\alpha_{k-1}(s_0')$, $\alpha_{k-1}(s_1')$ and $\beta_{k+1}(s_0')$, $\beta_{k+1}(s_1')$.

4. A method as claimed in claim 1, further comprising the step of normalized the values of $\gamma_j(R_k,s_j',s)(j=0, 1)$ to zero in each iteration.

5. A method as claimed in claim 1, further comprising the step of normalizing current values of the forward state metrics by adding a maximum value ($S_{max}$) of the previous values ($\alpha_{k-1}(s)$ at time k−1.

6. A decoder for a convolutionally encoded data stream having multiple states s, the data stream having been encoded by an encoder, comprising:

a normalization unit for normalizing the branch metric quantities $$\gamma_j(R_k,s_j',s)=\log(Pr(d_k=j,S_k=s,R_k|S_{k-1}=s_j'))$$

to provide normalized quantities $\gamma'_j(R_k,s_j',s)(j=0, 1)$ adders for adding normalized quantities $\gamma'_j(R_k,s_j',s)(j=0, 1)$ to forward state metrics $\alpha_{k-1}(s_0')$, $\alpha_{k-1}(s_1')$, and reverse state metrics $\beta_{k+1}(s_0')$, $\beta_{k+1}(s_1')$, where $$\alpha_k(s) = \log(Pr\{S_k = s \mid R_1^k\})$$

$$\beta_k(s) = \log\left(\frac{Pr\{R_{k+1}^N S_k = s\}}{Pr\{R_{k+1}^N \mid R_1^N\}}\right)$$

a multiplexer and log unit for multiplexing the outputs of the adders to produce corrected cumulative metrics $\alpha_k'(s)$, and $\beta_k'(s)$, and a second normalization unit for normalizing the corrected cumulative metrics $\alpha_k'(s)$ and $\beta_k'(s)$ to produce desired outputs $\alpha_k(s)$ and $\beta_k(s)$ where Pr represents probability, $R_1^k$ represents received bits from time index 1 to k and $S_k$ represents the state of the encoder at time index k, from previous values of $\alpha_k(s)$ and future values of $\beta_k(s)$, and from quantities $\gamma'_j(R_k,s_j',s)(j=0, 1)$ where $\gamma'_j(R_k,s_j',s)(j=0, 1)$ is a normalized value of $\gamma_j(R_k,s_j',s)(j=0, 1)$, $R_k$ represents received bits at time index k, and $d_k$ represents transmitted data at time k.

7. A decoder as claimed in claim 6, wherein said second normalization unit performs a computation $S_{max}$ on each of previous value $\alpha_{k-1}(s)$, and future value $\beta_{k+1}(s)$, and a further adder is provided to add $S_{max}$ to value $\alpha_k'(s)$ and value $\beta_k'(s)$.

8. A decoder as claimed in claim 6, wherein said first normalization unit comprises a comparator receiving inputs $\gamma_0$, $\gamma_1$ having an output connected to select inputs of multiplexers, a first pair of said multiplexers receiving said respective inputs $\gamma_0$, $\gamma_1$, a subtractor for subtracting outputs of said first pair of multiplexers, an output of said subtractor being presented to first inputs of a second pair of said multiplexers, second inputs of said second pair of multiplexers receiving a zero input.

9. A method for decoding a convolutionally encoded codeword having multiple states s using a turbo decoder with x bit representation and a dynamic range of $2^{x-1}-1$ to $-(2^{x-1}-1)$, comprising the steps of:

a) defining a trellis representation of possible states and transition branches of the convolutional codeword having a block length N, N being the number of received samples in the codeword;

b) initializing each starting state metric $\alpha_{-1}(s)$ of the trellis for a forward iteration through the trellis;

c) calculating branch metrics $\gamma_{k0}(s_0',s)$ and $\gamma_{k1}(s_1',s)$;

d) determining a branch metric normalizing factor;

e) normalizing the branch metrics by subtracting the branch metric normalizing factor from both of the branch metrics to obtain $\gamma_{k1}'(s_1',s)$ and $\gamma_{k0}'(s_0',s)$;

f) summing $\alpha_{k-1}(s_1')$ with $\gamma_{k1}'(s_1',s)$, and $\alpha_{k-1}(s_0')$ with $\gamma_{k0}'(s_0',s)$ to obtain a cumulated maximum likelihood metric for each branch;

g) selecting the cumulated maximum likelihood metric with the greater value to obtain $\alpha_k(s)$;

h) repeating steps c) to g) for each state of the forward iteration through the entire trellis;

i) defining a second trellis representation of possible states and transition branches of the convolutional codeword having the same states and block length as the first trellis;

j) initializing each starting state metric $\beta_{N-1}(s)$ of the trellis for a reverse iteration through the trellis;

k) calculating the branch metrics $\gamma_{k0}(s_0',s)$ and $\gamma_{k1}(s_1',s)$;

l) determining a branch metric normalization term;

m) normalizing both of the branch metrics determined in step k) by subtracting the branch metric normalization term from both of the branch metrics determined in step k) to obtain $\gamma_{k1}'(s_1',s)$ and $\gamma_{k0}'(s_0',s)$;

n) summing $\beta_{k+1}(s_1')$ with $\gamma_{k1}'(s_1',s)$, and $\beta_{k+1}(s_0')$ with $\gamma_{k0}'(s_0',s)$ to obtain a cumulated maximum likelihood metric for each branch;

o) selecting the cumulated maximum likelihood metric with the greater value as $\beta_k(s)$;

p) repeating steps k to o for each state of the reverse iteration through the entire trellis;

q) calculating soft decision values $P_1$ and $P_0$ for each state; and r) calculating a log likelihood ratio at each state to obtain a hard decision thereof.

10. The method according to claim 9, wherein step d) includes selecting the branch metric with the greater value to be the branch metric normalizing factor.

11. The method according to claim 9, wherein step 1 includes selecting the branch metric with the greater value to be the branch metric normalizing term.

12. The method according to claim 9, further comprising:

determining a maximum value of $\alpha_k(s)$; and normalizing the values of $\alpha_k(s)$ by subtracting the maximum value of $\alpha_k(s)$ from each value $\alpha_k(s)$.

13. The method according to claim 9, further comprising:

determining a maximum value of $\alpha_{k-1}(s)$; and normalizing the values of $\alpha_k(s)$ by subtracting the maximum value of $\alpha_{k-1}(s)$ from each value $\alpha_k(s)$.

14. The method according to claim 9, further comprising: normalizing $\alpha_k(s)$ by subtracting a forward state normalizing factor, based on the values of $\alpha_{k-1}(s)$, to reposition the values of $\alpha_k(s)$ proximate the center of said dynamic range.

15. The method according to claim 14, wherein, when any one of the values of $\alpha_{k-1}(s)$ is greater than zero, the normalizing factor is between 1 and 8.

16. The method according to claim 14, wherein, when all of the values of $\alpha_{k-1}(s)$ are less than zero and any one of the values of $\alpha_{k-1}(s)$ is greater than $-2^{x-2}$, the normalizing factor is about $-2^{x-3}$.

17. The method according to claim 14, wherein, when all of the values of $\alpha_{k-1}(s)$ are less than $-2^{x-2}$, the normalizing factor is a bit OR value for each $\alpha_{k-1}(s)$.

18. The method according to claim 9, further comprising:

determining a maximum value of $\beta_k(s)$;

and normalizing the values of $\beta_k(s)$ by subtracting the maximum value of $\beta_k(s)$ from each value $\beta_k(s)$.

19. The method according to claim 9, further comprising:

determining a maximum value of $\beta_{k+1}(s)$; and normalizing the values of $\beta_k(s)$ by subtracting the maximum value of $\beta_{k+1}(s)$ from each $\beta_k(s)$.

20. The method according to claim 9, further comprising:

normalizing $\beta_k(s)$ by subtracting a reverse normalizing factor, based on the values of $\beta_{k+1}(s)$, to reposition the values of $\beta_k(s)$ proximate the center of said dynamic range.

21. The method according to claim 20, wherein when any one of the values of $\beta_{k+1}(s)$ is greater than zero the reverse normalizing factor is between 1 and 8.

22. The method according to claim 20, wherein when all of the values of $\beta_{k+1}(s)$ are less than zero and any one of the $\beta_{k+1}(s)$ values is greater than $-2^{x-2}$ the normalizing factor is about $-2^{x-3}$.

23. The method according to claim 20, wherein when all of the values of $\beta_{k+1}(s)$ are less than $-2^{x-2}$ the normalizing factor is a bit OR value for each $\beta_{k+1}(s)$.

24. A turbo decoder system with x bit representation for decoding a convolutionally encoded codeword comprising:

receiving means for receiving a sequence of transmitted signals;

trellis means with block length N defining possible states and transition branches of the convolutionally encoded codeword;

decoding means for decoding said sequence of signals during a forward iteration and a reverse iteration through said trellis means, said decoding means including:

branch metric calculating means for calculating branch metrics $\gamma_{k0}(s_0',s)$ and $\gamma_{k1}(s_1',s)$; for use during said forward iteration and during said reverse iteration;

branch metric normalizing means for normalizing the branch metrics to obtain normalized branch metrics $\gamma_{k1}'(s_1',s)$ and $\gamma_{k0}'(s_0',s)$ during said forward iteration and during said reverse iteration;

summing means for adding state metrics $\alpha_{k-1}(s_1')$ with normalized branch metrics $\gamma_{k1}'(s_1',s)$, and state metrics $\alpha_{k-1}(s_0')$ with normalized branch metrics $\gamma_{k0}'(s_0',s)$ during said forward iteration to obtain cumulated metrics for each branch and for adding state metrics $\beta_{k+1}(s_1')$ with normalized branch metrics $\gamma_{k1}(s_1',s)$ and state metrics $\beta_{k+1}(s_0')$ with normalized branch metrics $\gamma_{k0}(s_0',s)$ during said reverse iteration to obtain cumulate metrics for each branch;

and selecting means for choosing, during the forward iteration, the cumulated metric with the greater value to obtain $\alpha_k(s)$ and, during said reverse iteration, the cumulated metric with the greater value to obtain $\beta_k(s)$;

soft decision calculating means for determining the soft decision values $P_{k0}$ and $P_{k1}$; and log likelihood ratio (LLR) calculating means for determining from the soft decision values the log likelihood ratio for each state to obtain a hard decision therefor.

25. The system according to claim 24, wherein, during the forward iteration, said branch metric normalizing means determines which branch metric $\gamma_{k0}'(s_0',s)$ or $\gamma_{k1}'(s_1',s)$ has the greater value, and subtracts the branch metric with the greater value from both branch metrics.

26. The system according to claim 24, further comprising state metric normalizing means for normalizing the values of state metrics $\alpha_k(s)$ during the forward iteration, by subtracting a forward state metric normalizing factor from each state metric value $\alpha_k(s)$.

27. The system according to claim 26, wherein the state metric normalizing means uses a forward state metric normalizing factor that is a maximum value of $\alpha_k(s)$.

28. The system according to claim 26, wherein the state metric normalizing means uses a forward state metric normalizing factor that is a maximum value of $\alpha_{k-1}(s)$.

29. The system according to claim 26, wherein the state metric normalizing means uses a forward state metric normalizing factor that is between 1 and 8, when any one of the values of $\alpha_{k-1}(s)$ is greater than 0.

30. The system according to claim 26, wherein the state metric normalizing means uses a state metric normalizing factor that is about $-2^{x-3}$, when all of the state metric values $\alpha_{k-1}(s)$ are less than 0 and any one of the state metric values $\alpha_{k-1}(s)$ is greater than $-2^{x-2}$.

31. The system according to claim 26, wherein the state metric normalizing means uses a state metric normalizing factor that is a bit OR value for each state metric value $\alpha_{k-1}(s)$, when all of the state metric values $\alpha_{k-1}(s)$ are less than $-2^{x-2}$.

32. The system according to claim 24, wherein, during the reverse iteration, the reverse state metric normalizing means normalizes the values of $\beta_k(s)$ by subtracting a reverse state metric normalizing factor.

33. The system according to claim 32, wherein the state metric normalizing means uses a reverse state metric normalizing factor that is a maximum value of $\beta_k(s)$.

34. The system according to claim 32, wherein the state metric normalizing means uses a reverse state metric normalizing factor that is a maximum value of $\beta_{k+1}(s)$.

35. The system according to claim 32, wherein the state metric normalizing means uses a reverse state metric normalizing factor that is between 1 and 8, when any one of the values of $\beta_{k+1}(s)$ is greater than 0.

36. The system according to claim 32, wherein the state metric normalizing means uses a state metric normalizing factor that is about $-2^{x-3}$, when all of the values of $\beta_{k+1}(s)$ are less than 0 and any one of the values of $\beta_{k+1}(s)$ is greater than $-2^{x-2}$.

37. The system according to claim 32, wherein the state metric normalizing means uses a state metric normalizing factor that is a bit OR value for each value of $\beta_{k+1}(s)$ when all of the values of $\beta_{k+1}(s)$ are less than $-2^{x-2}$.

38. The system according to claim 24, wherein the decoding means comprises a single decoder for performing both said forward and reverse iterations.

* * * * *